US 6,724,660 B2

(12) United States Patent
Skotnicki et al.

(10) Patent No.: US 6,724,660 B2
(45) Date of Patent: Apr. 20, 2004

(54) INTEGRATED SEMICONDUCTOR MEMORY DEVICE HAVING QUANTUM WELL BURIED IN A SUBSTRATE

(75) Inventors: Thomas Skotnicki, Crolles (FR); Stephane Monfray, Grenoble (FR); Michel Haond, Crolles (FR)

(73) Assignee: STMicroelectronics S.A., Montrouge (FR)

( * ) Notice: Subject to any disclaimer, the term of this patent is extended or adjusted under 35 U.S.C. 154(b) by 33 days.

(21) Appl. No.: 10/022,185

(22) Filed: Dec. 12, 2001

(65) Prior Publication Data

US 2002/0097608 A1 Jul. 25, 2002

(30) Foreign Application Priority Data

Dec. 12, 2000 (FR) .............................. 00 16174

(51) Int. Cl.$^7$ .............................................. G11C 16/04
(52) U.S. Cl. .......................... 365/185.27; 365/185.18
(58) Field of Search ................... 365/185.27, 185.18; 357/22

(56) References Cited

U.S. PATENT DOCUMENTS

| 4,683,484 A | * | 7/1987 | Derkits, Jr. .................. 257/20 |
| 4,989,052 A | * | 1/1991 | Okada et al. ................ 257/194 |
| 5,021,841 A | * | 6/1991 | Leburton et al. ........... 257/256 |
| 5,111,255 A | * | 5/1992 | Kiely et al. ................... 372/45 |
| 6,083,796 A | | 7/2000 | Park et al. ................... 438/294 |

FOREIGN PATENT DOCUMENTS

| EP | 0 348 099 | 12/1989 |
| WO | WO 97/23000 | 6/1997 |

OTHER PUBLICATIONS

Garone, P.M., Venkataraman, V. and Sturm, J.C., "Hole Confinement in MOS–Gated Ge$_x$Si$_{1-x}$/Si Heterostructures," IEEE Electron Device Letters, vol. 12, No. 5, pp. 230–232, May 1991.

Research Disclosure, "MOS Transistors with Bottom–Isolated Source/Drain Regions," Kenneth Mason Publications, No. 398, pp. 378–379, XP000726504, Hampshire, Great Britain, Jun. 1, 1997.

French Preliminary Search Report dated Sep. 13, 2001 for French Application No. 0016174.

* cited by examiner

*Primary Examiner*—Van Thu Nguyen
*Assistant Examiner*—Tuan T. Nguyen
(74) *Attorney, Agent, or Firm*—Lisa K. Jorgenson; Jose Gutman; Fleit, Kain, Gibbons, Gutman, Bongini & Bianco P.L.

(57) ABSTRACT

An electronic device, such as an opto-electronic device and an integrated semiconductor memory device, includes at least one integrated memory point structure including a quantum well semiconductor area buried in the substrate of the structure and disposed under the insulated gate of a transistor. A biasing voltage source is adapted to bias the structure to enable charging or discharging of charges in the quantum well or outside the quantum well.

25 Claims, 5 Drawing Sheets

INTEGRATED SEMICONDUCTOR MEMORY DEVICE HAVING QUANTUM WELL BURIED IN A SUBSTRATE

CROSS-REFERENCE TO RELATED APPLICATIONS

This application is based upon and claims priority from prior French Patent Application No. 0016174, filed on Dec. 12, 2000, the entire disclosure of which is herein incorporated by reference.

BACKGROUND OF THE INVENTION

1. Field of the Invention

The invention related to integrated circuits and more particularly to semiconductor memory devices and especially, although not exclusively, to so-called "embedded" memories, which are implemented conjointly with other components by the same technological process, for example, and intended to be integrated together into an application-specific integrated circuit (ASIC).

2. Description of the Prior Art

Dynamic random access memories (DRAM) represent close to two thirds of worldwide memory production. At present, in the integration race, there a two dominant architectures, known to those of ordinary skill in the art by the names "trench cells" and "stacked cells".

In a trench cells architecture the memory capacitor is implemented by a trench formed in the substrate alongside the memory point access transistor.

In a stacked cells architecture the memory capacitor is implemented on top of the access transistor and projects slightly from it.

Although technologically complex, these two architectures are easier to apply to integrated circuits including only memories, and are difficult to integrate as embedded memories in integrated circuits, especially in CMOS integrated circuits.

Memories available off the shelf include read-only memories and in particular electrically-programmable read-only memories (EPROM). These memories have the advantage of a more compact overall size than a DRAM, but the drawback of a longer read time than a DRAM.

On the other hand, a DRAM has a shorter read and write time than an EPROM, but its overall size is larger.

Accordingly, there exists a need for overcoming the disadvantages of the prior art as discussed above, and in particular for providing a memory device that is small in size while fast in operation.

SUMMARY OF THE INVENTION

The invention aims to propose a new integrated semiconductor memory device that combines the advantage of small overall size, like that of an EPROM, with a read and write time comparable to that of a DRAM, i.e. faster than an EPROM.

A preferred embodiment of the present invention therefore proposes an integrated semiconductor memory device including at least one integrated memory point structure including a quantum well semiconductor area buried in the substrate of the structure and disposed under the insulated gate of a transistor. The device also includes biasing means adapted to bias the structure to enable charging or discharging of charges in the quantum well or outside the quantum well.

One benefit of the proposed structure is that the quantity of charge stored is very small, which eliminates the need for a dedicated storage capacitor. The read sensitivity is not destroyed however, thanks to using the gain of the transistor in the read process. The structure according to the invention therefore has the advantage of a charge storage area under the access transistor with a very short read and write time, and accordingly has integration and density capabilities improved over the architectures of memories currently in production.

What is more, the greater sensitivity of the new structure also predisposes it to opto-electronic applications, for example in image sensors, light detectors or opto-electronic components.

Unlike EPROM structures, the barrier that traps the charges is a quantum well, rather than a layer of oxide, which means that the process of charging and discharging the memory according to the invention does not require the passage of a current through an oxide. This is particularly advantageous from the point of view of speed and the reliability of the memory structure according to the invention.

In one embodiment of the invention, the substrate is formed of a first semiconductor material having a first type of conductivity. The first material can be P-doped silicon, for example if the memory is an NMOS structure. The quantum well area is formed of a buried semiconductor layer and composed of a second semiconductor material having the first type of conductivity and a gap between the valency band and the conduction band smaller than the corresponding gap of the first material.

The second material can be a silicon-germanium alloy, for example. The memory point structure also includes buried insulative regions extending laterally between said buried semiconductor layer (the quantum well) and the source and drain regions of the transistor. The memory point structure also includes a channel region of the transistor situated in the upper part of the substrate above the buried semiconductor layer, and weakly doped source and drain extension areas (NLDD areas in the case of an NMOS structure) extending between the channel region and the source and drain regions and over at least part of the buried insulative regions.

In this regard, it is preferable for the length of the quantum well area to be substantially equal to the length of the gate. This is because, the shorter the quantum well area, the less memory effect the structure will have. Conversely, the larger the quantum well area, the higher the risk of recombination of carriers between the quantum well area and the source and drain extension areas.

One of ordinary skill in the art will naturally know how to adjust the length of the quantum well area to suit the intended application.

When the first material is silicon and the second material is a silicon-germanium alloy, the percentage of germanium affects the height of the barrier "seen" by the carriers trapped in the quantum well and the connection of the lattices with the silicon during the epitaxial growth process used in the fabrication of the device according to the invention.

To be more precise, the lower the percentage of germanium, the lower the barrier seen by carriers trapped in the quantum well.

Also, the higher the percentage of germanium, the more problematical the linking of the silicon-germanium lattice with the silicon lattice will be during epitaxial growth.

In other words, the higher the percentage of germanium, the greater the risk of relaxation of the silicon-germanium, causing the appearance of dislocations in the silicon, and possibly leading to non-functioning of the memory.

Once again, one of ordinary skill in the art will know how to adjust the percentage of germanium to be used, in particular as a function of the thickness of the material. For example, a percentage of germanium less than or equal to 50% and greater than or equal to 20% would be chosen for a thickness of the order of 10 nanometers. The percentage of germanium could be increased for smaller thicknesses.

The doping of the quantum well area also affects the behavior of the memory point structure. The higher the doping of the quantum well area, the higher the barrier. Conversely, the lower the doping of the quantum well area, the lower the barrier, leading to a shorter charge confinement time, and consequently a faster loss of the memory effect.

The doping used depends on the intended application. For example, the quantum well area can be doped to a concentration from $10^{17}$ at/cm$^3$ to $10^{20}$ at/cm$^3$.

Similarly, the doping of the substrate is advantageously chosen to be sufficient to enable operation of the transistor. It is also preferable for the doping not to be too high. In the area of the conduction channel of the transistor (in the upper part of the substrate), doping that is too high can modify the drain current due to the presence of confined holes, while in the area of the substrate (in the lower part of the substrate), doping that is too high affects the curvature of the valency band and consequently the tendency of the charges to be evacuated.

For example, the substrate is preferably doped to a concentration less than or equal to $10^{19}$ at/cm$^3$ and greater than $10^{15}$ at/cm$^3$.

BRIEF DESCRIPTION OF THE DRAWING

Other advantages and features of the invention will become apparent on examining the following detailed description of one non-limiting embodiment and the accompanying drawings, in which.

DESCRIPTION OF THE PREFERRED EMBODIMENTS

Figure 1:
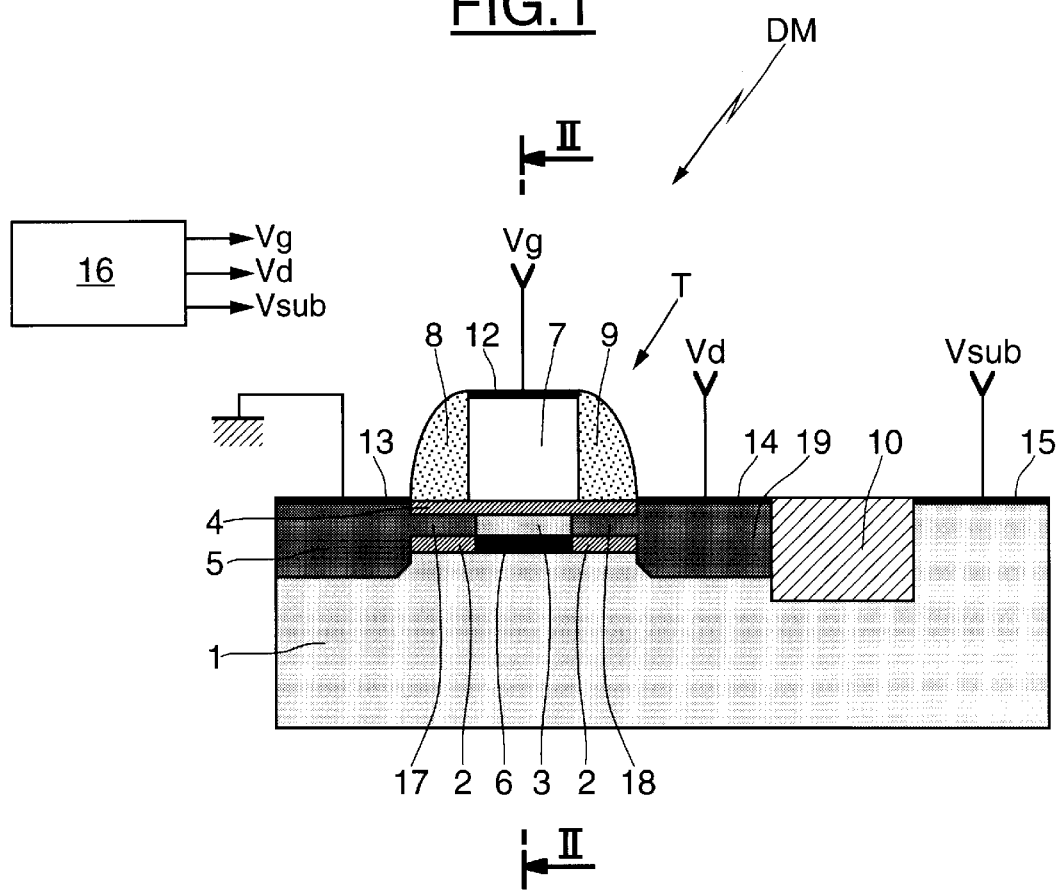
FIG. 1 shows diagrammatically one preferred embodiment of an integrated semiconductor memory device according to the invention.

FIG. 1 shows an integrated semiconductor memory device DM according to a preferred embodiment of the present invention, for example an NMOS device.

The device has a semiconductor substrate 1, for example of silicon, of the P conductivity type (because this embodiment of a device according to the invention is an NMOS device, for example).

The substrate has on the left (as seen in FIG. 1) an electrical isolation region 10 (of the conventional LOCOS or shallow trench type) and an active area within which a quantum well area and the access transistor T of the memory point are formed, as described in more detail below. To the right of the isolating region 10, on the top surface of the substrate 1, is a metallic contact 15 for biasing the substrate 1 of the device to a substrate voltage Vsub.

The integrated structure of the memory point of the device according to the invention further includes a semiconductor area 6 forming a quantum well. The quantum well area 6 is buried in the substrate 1 and disposed under the insulated gate 7 of the transistor T (which in this example is an NMOS transistor).

Here the quantum well area 6 is formed of a semiconductor material, for example a silicon-germanium alloy, having the same type of conductivity as the material of the substrate (in this example type P conductivity). The quantum well area 6 is delimited laterally by buried insulative regions 2 (dielectric "plugs") formed of an insulative material such as silicon dioxide.

The buried insulative regions 2 extend as far as the source and drain regions 5 and 19 of the transistor. The source and drain regions, which in this example are of type N, are strongly doped, for example to a concentration of $10^{20}$ at/cm$^3$.

The source and drain regions 5 and 19 are conventionally extended by source and drain extension regions 17 and 18 (NLDD areas) which are not so strongly doped. For example, these areas, which are also of type N, can be doped to a concentration of the order of $10^{16}$ to $10^{19}$ at/cm$^3$.

The extension areas 17 and 18 delimit an upper part 3 of the substrate forming the channel region of the transistor T.

In the example described here, the quantum well area 6 is slightly smaller than the length of the gate 7 and the source and drain extension areas 17 and 18 extend over substantially all of the dielectric plugs 2 without overlapping the quantum well area 6.

The transistor T also includes a gate oxide layer 4, for example of silicon dioxide. Finally, in the conventional way, the gate 7, which is of type N polysilicon, for example, is flanked by insulative spacers 8 and 9.

Finally, source, drain and gate metallizations (contacts) 13, 14 and 12 are respectively formed on the source, drain and gate regions to enable the application of predetermined bias voltages.

For example the source is connected to ground, a gate bias voltage Vg is applied to the gate, and a drain bias voltage Vd is applied to the drain.

All the bias voltages Vg, Vd and Vsub are supplied by biasing means 16 formed by one or more voltage sources, for example.

Silicon has a gap between the valency band and the conduction band equal to approximately 1.12 eV. Pure germanium has a gap between the valency band and the conduction band equal to 0.66 eV. A silicon-germanium alloy has a gap from 0.66 to 1.12 eV, depending on the percentage of germanium in the alloy.

Figure 2:
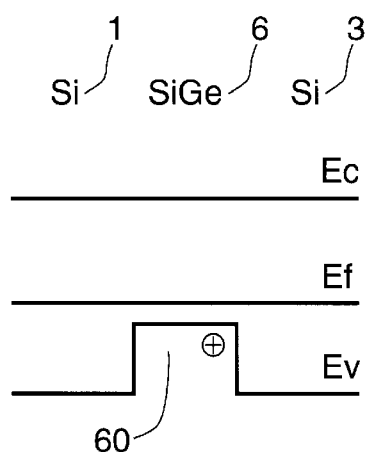
FIG. 2 shows a band diagram of the device shown in FIG. 1 for the vertical direction.

Accordingly, if the two materials (silicon and silicon-germanium alloy) are in contact, there is an alignment of the Fermi levels Ef of the two materials, as shown in FIG. 2. Also, given the difference between the gaps, there is created between the silicon in the lower part of the substrate 1, the silicon-germanium alloy 6 and the silicon 3 of the conduction channel a potential barrier at the level of the valency band Ev, causing the appearance of a quantum well (charge confinement area) 60.

In this example, because the level of the conduction band Ec of both materials is substantially the same, the conduction bands are also substantially aligned.

In the example described here, the percentage of germanium in the $Si_{1-x}Ge_x$ alloy is equal to 50% (x=0.50) and the concentration of dopant in the silicon-germanium layer 6 is of the order of $3.10^{18}$ at/cm$^3$.

The concentration of dopant in the lower part of the substrate 1 is equal to $10^{16}$ at/cm$^3$ and the concentration of dopant in the channel area 3 is equal to $10^{16}$ at/cm$^3$, for example.

The integrated memory point structure according to the invention therefore has a charge confinement area in the vertical direction. To be more precise, when the memory point is to be written, the substrate is biased to +1 volt (Vsub=+1 volt), for example, and the gate bias voltage Vg is equal to +0.25 volt, for example. The drain voltage Vd is maintained at 0.1 volt, for example.

Accordingly, there is a displacement of positive charges (holes) from the substrate to the gate. Because of the difference between the levels of the valency bands, the holes pass into the silicon-germanium area 6 and encounter a barrier. The holes are therefore trapped in the quantum well 6 (confinement area 60).

Figure 3:
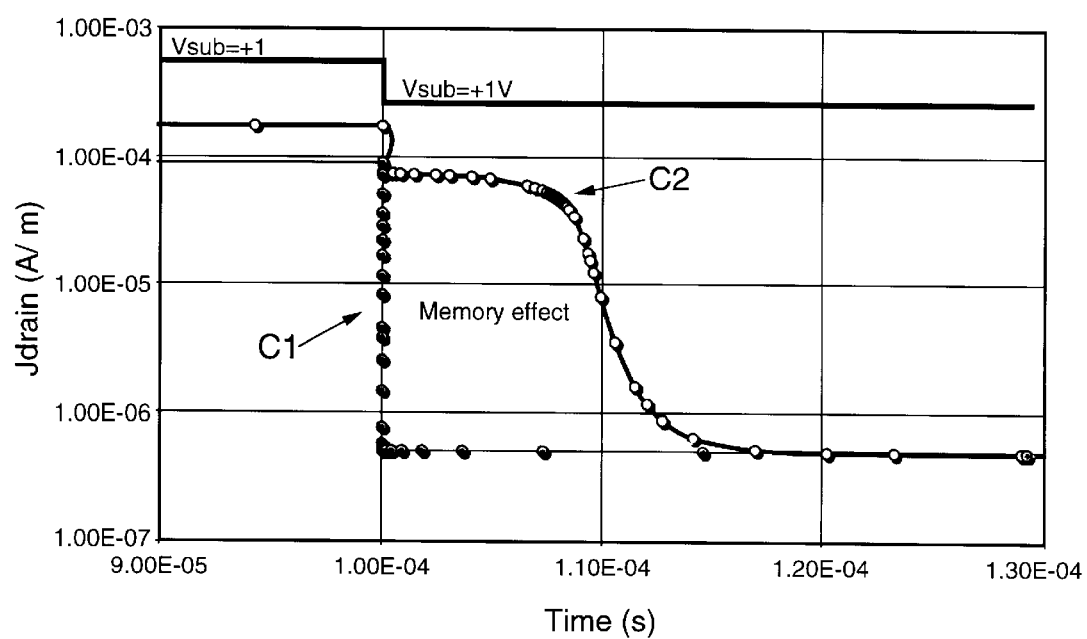
FIG. 3 shows in the form of a curve the memory effect obtained by a device according to the invention.

As shown in FIG. 3, as a result of this the drain current is increased, in the example described to $10^{-4}$ A/$\mu$m.

To read the memory point a negative substrate voltage Vsub is applied, for example equal to –1 volt, to guarantee a depleted regime under the gate, including in the silicon-germanium layer 6. The holes then remain trapped in the quantum well layer 6 and gradually disappear through recombination with a time constant which in this example is of the order of $10^{-4}$ to $10^{-5}$ second. The drain current is then progressively reduced along the curve C2 in FIG. 3.

In the absence of a quantum well area, the drain current would be reduced along the curve C1 (showing the behavior of a conventional transistor). The difference in drain current between the curves C1 and C2 is of the order of two decades, which is readily detectable and representative of the memory effect of the device according to the invention.

The dielectric plugs 2 at the ends of the quantum well area 6 separate the quantum well 6 from the source and drain regions, thereby preventing evacuation of charges when the gate imposes the depleted regime.

The principal steps of a method for obtaining an integrated memory point structure according to the invention are described next with reference to FIGS. 4a to 4g in particular.

The starting point is therefore a silicon substrate, in which insulative regions like the region 10 are formed in a conventional way known in the art, to define the various active areas of the various components to be formed on the substrate. For simplicity, FIGS. 4a to 4g show only the part to the left of the insulative region 10 shown in FIG. 1.

Figure 4A:
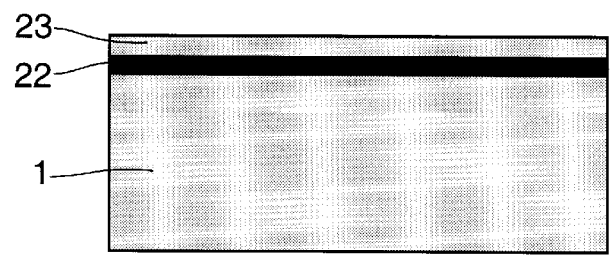
FIGS. 4a to 4g show diagrammatically the principal steps of a fabrication process for obtaining a device according to the invention.

As shown in FIG. 4a, the process begins by successively depositing the layer 22 of the second material (in this example the silicon-germanium alloy) onto the silicon substrate 1 by selective epitaxial growth. The thickness of the layer 22 is generally from 1 to 50 nm, for example 20 nm. A silicon layer 23 is then deposited on the layer 22 by selective epitaxial growth, and also has a thickness of the order of 1 to 50 nm, for example 20 nm.

Figure 4B:
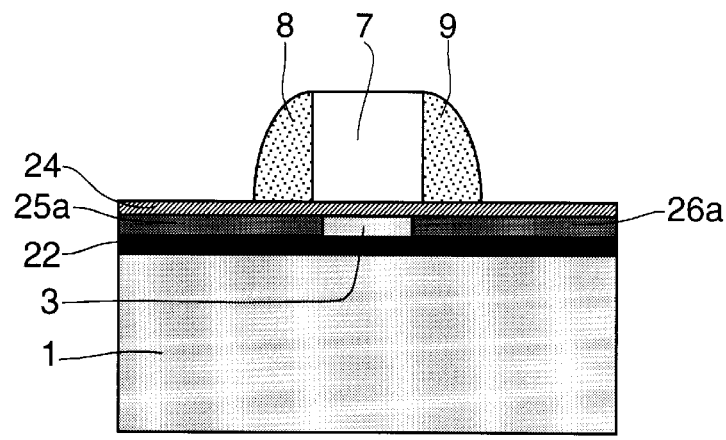

As shown in FIG. 4b, the gate oxide layer 24 (of SiO$_2$ for example) is then formed in a conventional way, after which a silicon gate 7 is formed on top of the gate oxide layer 24. Doped areas 25a and 26a are then formed in the silicon layer 23, by conventional implantation techniques, and are used subsequently to form the extensions 17 and 18 of the source and drain regions. This implantation is carried out before forming the spacers 8 and 9 (of Si$_3$N$_4$ for example). Note also that the gate 7 can be protected by a layer of silicon oxinitride (not shown here).

Figure 4C:
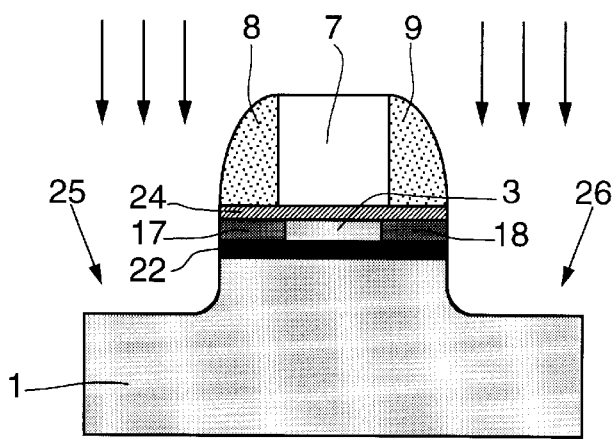

As shown in FIG. 4c, the gate oxide layer 24, the silicon layer 23, the silicon-germanium layer 22, and possibly an upper part of the silicon substrate 1 are then etched, for example using a plasma, on each side of the spacers 8 and 9, to form two lateral recesses 25 and 26.

Figure 4D:
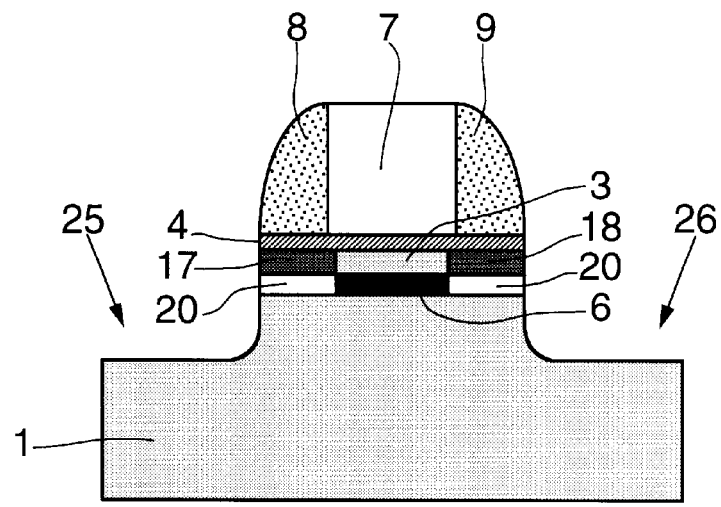

As shown in FIG. 4d, the silicon-germanium layer is then selectively etched laterally. This selective lateral etching is a very gentle plasma etching, for example, known to the skilled person. The etching time depends on the residual length required for the silicon-germanium layer 6 forming the quantum well area. For example, a time is chosen that is sufficiently short, for example of the order of a few tens of seconds, to obtain an acceptable residual length.

Dielectric plugs are then formed in the cavities 20 resulting from the selective etching of the silicon-germanium alloy. This is effected by re-oxidation in a furnace, for example. As a result the cavities 20 are filled with silicon dioxide, for example, and an insulative material is deposited over all the silicon areas (to a thickness of approximately 200 Å, for example).

Figure 4E:
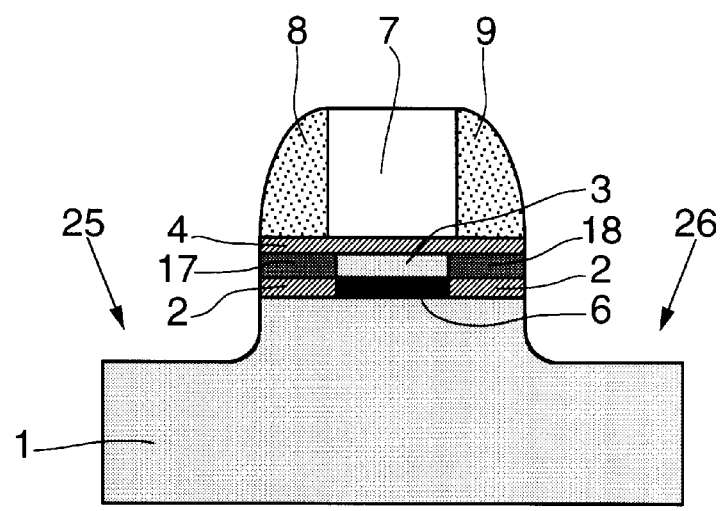

The bottom of the recesses 25 and 26 is then cleaned, for example using a chemical solution based on hydrofluoric acid, applied for a few minutes, to obtain the structure shown in FIG. 4e.

Figure 4F:
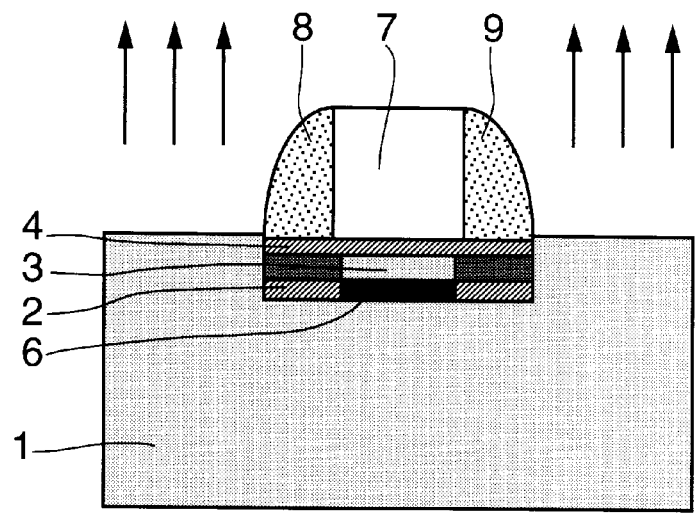
Figure 4G:
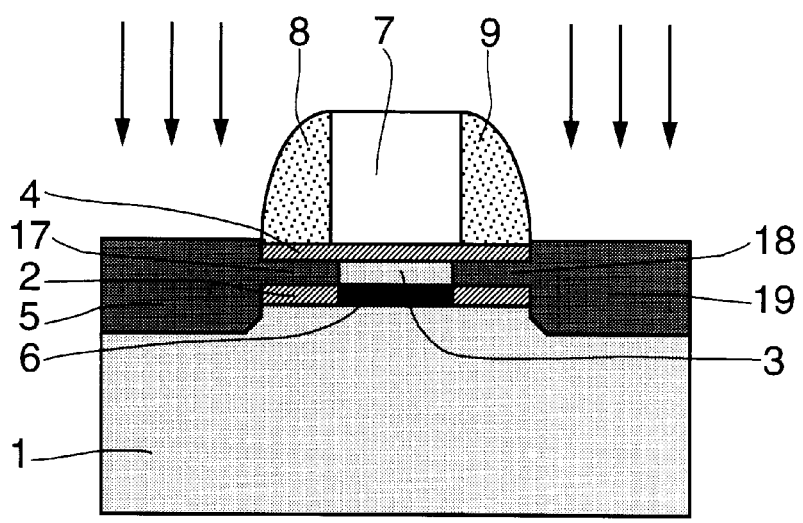

As shown in FIG. 4f, selective epitaxial growth silicon then fills in the recesses 25 and 26. Dopant is then implanted to form the source and drain regions 5 and 19, as shown in FIG. 4g.

The structure is completed, for example by forming contacts, in an entirely conventional manner.

The invention is not limited to the embodiments that have just been described, but encompasses all variants thereof. Thus the charges can be trapped in the quantum well in different ways (potential pulse on the gate, on the substrate, generation by impact, optical generation, etc.).

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An integrated semiconductor memory device comprising:
   at least one integrated memory point structure including
      a quantum well area buried in a substrate of the structure and disposed under an insulated gate of a transistor; and
      biasing means adapted to bias the structure to enable charging or discharging of charges in the quantum well or outside the quantum well.

2. The integrated semiconductor memory device according to claim 1, wherein the length of the quantum well area is substantially equal to the length of the gate.

3. The integrated semiconductor memory device according to claim 1, wherein the doping of the quantum well area is from $10^{17}$ at/cm$^3$ to $10^{20}$ at/cm$^3$.

4. The integrated semiconductor memory device according to claim 1, wherein the substrate is doped sufficiently to enable operation of the transistor and to a concentration less than or equal to $10^{19}$ at/cm$^3$.

5. The integrated semiconductor memory device according to claim 1, wherein the substrate is formed of a first semiconductor material having a first type of conductivity, in that the quantum well area is formed of a buried semiconductor layer and formed of a second semiconductor material having the first type of conductivity and a gap between the valency band and the conduction band smaller than the corresponding gap of the first semiconductor material, in that the memory point structure also includes buried insulative regions extending laterally between said buried semiconductor layer and a source region and a drain region of the transistor, a channel region of the transistor situated in the upper part of the substrate above the buried semiconductor layer, and a source extension area and a drain extension area extending between the channel region and the source and drain regions and over at least part of the buried insulative regions.

6. The integrated semiconductor memory device according to claim 5, wherein the length of the quantum well area is substantially equal to the length of the gate.

7. The integrated semiconductor memory device according to claim 5, wherein the doping of the quantum well area is from $10^{17}$ at/cm$^3$ to $10^{20}$ at/cm$^3$.

8. The integrated semiconductor memory device according to claim 5, wherein the substrate is doped sufficiently to enable operation of the transistor and to a concentration less than or equal to $10^{19}$ at/cm$^3$.

9. The integrated semiconductor memory device according to claim 5, wherein the first semiconductor material is silicon and in that the second semiconductor material is an alloy of silicon and germanium.

10. The integrated semiconductor memory device according to claim 9, wherein the percentage of germanium is less than or equal to 50.

11. The integrated semiconductor memory device according to claim 9, wherein the length of the quantum well area is substantially equal to the length of the gate.

12. The integrated semiconductor memory device according to claim 9, wherein the doping of the quantum well area is from $10^{17}$ at/cm$^3$ to $10^{20}$ at/cm$^3$.

13. The integrated semiconductor memory device according to claim 9, wherein the substrate is doped sufficiently to enable operation of the transistor and to a concentration less than or equal to $10^{19}$ at/cm$^3$.

14. An electronic device comprising:
at least one integrated memory point structure including
a quantum well area buried in a substrate of the structure and disposed under an insulated gate of a transistor; and
biasing means adapted to bias the structure to enable charging or discharging of charges in the quantum well or outside the quantum well.

15. The electronic device of claim 14, wherein the length of the quantum well area is substantially equal to the length of the gate.

16. The electronic device of claim 14, wherein the doping of the quantum well area is from $10^{17}$ at/cm$^3$ to $10^{20}$ at/cm$^3$.

17. The electronic device of claim 14, wherein the substrate is doped sufficiently to enable operation of the transistor and to a concentration less than or equal to $10^{19}$ at/cm$^3$.

18. The electronic device of claim 14, wherein the substrate is formed of a first semiconductor material having a first type of conductivity, in that the quantum well area is formed of a buried semiconductor layer and formed of a second semiconductor material having the first type of conductivity and a gap between the valency band and the conduction band smaller than the corresponding gap of the first material, in that the memory point structure also includes buried insulative regions extending laterally between said buried semiconductor layer and a source region and a drain region of the transistor, a channel region of the transistor situated in the upper part of the substrate above the buried semiconductor layer, and a source extension area and a drain extension area extending between the channel region and the source and drain regions and over at least part of the buried insulative regions.

19. The electronic device of claim 18, wherein the length of the quantum well area is substantially equal to the length of the gate.

20. The electronic device of claim 18, wherein the doping of the quantum well area is from $10^{17}$ at/cm$^3$ to $10^{20}$ at/cm$^3$.

21. The electronic device of claim 18, wherein the substrate is doped sufficiently to enable operation of the transistor and to a concentration less than or equal to $10^{19}$ at/cm$^3$.

22. The electronic device of claim 18, wherein the first material is silicon and in that the second material is an alloy of silicon and germanium.

23. The electronic device of claim 18, wherein the percentage of germanium is less than or equal to 50.

24. The electronic device of claim 14, comprising:
an opto-electronic device that includes:
at least one integrated memory point structure including
a quantum well semiconductor area buried in a substrate of the structure and disposed under an insulated gate of a transistor; and
biasing means adapted to bias the structure to enable charging or discharging of charges in the quantum well or outside the quantum well.

25. The electronic device of claim 14, wherein the biasing means comprises at least one voltage source.

* * * * *